United States Patent
Lee et al.

(10) Patent No.: US 12,032,239 B2
(45) Date of Patent: Jul. 9, 2024

(54) BACKLIGHT UNIT USING SEMICONDUCTOR LIGHT-EMITTING ELEMENT

(71) Applicant: LG ELECTRONICS INC., Seoul (KR)

(72) Inventors: Hyunho Lee, Seoul (KR); Wootae Kim, Seoul (KR); Moongi Jeong, Seoul (KR); Changguk Lee, Seoul (KR); Jinseok Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 27 days.

(21) Appl. No.: 17/618,170

(22) PCT Filed: Feb. 6, 2020

(86) PCT No.: PCT/KR2020/001694
§ 371 (c)(1),
(2) Date: Dec. 10, 2021

(87) PCT Pub. No.: WO2020/251131
PCT Pub. Date: Dec. 17, 2020

(65) Prior Publication Data
US 2022/0326570 A1 Oct. 13, 2022

(30) Foreign Application Priority Data

Jun. 11, 2019 (KR) .................. 10-2019-0068833

(51) Int. Cl.
*G02F 1/13357* (2006.01)
*H01L 33/00* (2010.01)
*H01L 33/50* (2010.01)

(52) U.S. Cl.
CPC .. *G02F 1/133603* (2013.01); *G02F 1/133606* (2013.01); *G02F 1/133611* (2013.01);
(Continued)

(58) Field of Classification Search
CPC ............ F21V 7/0083; G02F 1/133603; G02F 1/133611
See application file for complete search history.

(56) References Cited

U.S. PATENT DOCUMENTS 11,015,768 B2 * 5/2021 Yamamoto ............ H01L 33/507
11,069,831 B2 * 7/2021 Sasaoka .................. H01L 33/10
(Continued)

FOREIGN PATENT DOCUMENTS

KR         10-0622183 B1    9/2006
KR    10-2014-0021358 A    2/2014
(Continued)

*Primary Examiner* — Andrew J Coughlin
(74) *Attorney, Agent, or Firm* — Birch, Stewart, Kolasch & Birch, LLP

(57) ABSTRACT

Discussed is a backlight unit, including a base substrate; a partition wall on the base substrate and including a plurality of grooves; semiconductor light-emitting devices on the base substrate and in the plurality of grooves, respectively; a phosphor layer defined in each of the plurality of grooves to cover the semiconductor light-emitting devices and absorbs light in a specific wavelength band to emit light in a wavelength band different from the light in the specific wavelength band; a light diffusion layer that above the phosphor layer and diffuses light; and a spacer between the partition wall and the light diffusion layer, wherein the spacer includes: a body part attached to the partition wall; and a protruding part protruding in a direction toward the light diffusion layer and attached to the light diffusion layer, such that the light diffusion layer and the phosphor layer are spaced apart from each other.

18 Claims, 8 Drawing Sheets

(52) U.S. Cl.
CPC .......... *H01L 33/005* (2013.01); *H01L 33/502* (2013.01); *H01L 2933/0041* (2013.01)

(56) References Cited

U.S. PATENT DOCUMENTS

| | | | | |
|---|---|---|---|---|
| 2004/0218390 | A1* | 11/2004 | Holman | H04N 9/315 257/E33.072 |
| 2005/0281050 | A1* | 12/2005 | Chou | G02F 1/133608 362/612 |
| 2007/0091584 | A1* | 4/2007 | Chang | G02F 1/133604 362/225 |
| 2007/0103908 | A1* | 5/2007 | Tabito | G02F 1/133608 362/240 |
| 2009/0128741 | A1* | 5/2009 | Peng | G02F 1/133605 349/67 |
| 2011/0051044 | A1* | 3/2011 | Segawa | G02B 5/0215 349/64 |
| 2011/0063850 | A1* | 3/2011 | Oide | G02F 1/133603 362/296.01 |
| 2012/0218752 | A1* | 8/2012 | Sumitani | G02F 1/133605 362/296.01 |
| 2012/0327330 | A1* | 12/2012 | Takahashi | G02B 5/0278 362/296.01 |
| 2013/0135539 | A1* | 5/2013 | Kamata | H04N 3/14 348/790 |
| 2013/0147347 | A1* | 6/2013 | Laporte | F21V 17/16 313/512 |
| 2017/0045779 | A1* | 2/2017 | Kamiyoshihara | G02F 1/133608 |
| 2017/0105296 | A1* | 4/2017 | Huang | F16B 5/0664 |
| 2017/0139276 | A1 | 5/2017 | Ulmer et al. | |
| 2018/0080625 | A1* | 3/2018 | Yamada | F21V 7/0083 |
| 2018/0107067 | A1* | 4/2018 | Yamano | F21S 2/00 |
| 2019/0211996 | A1* | 7/2019 | Tamura | F21V 13/08 |

FOREIGN PATENT DOCUMENTS

| | | |
|---|---|---|
| KR | 10-2016-0076346 A | 6/2016 |
| KR | 10-2017-0061535 A | 6/2017 |

\* cited by examiner (a)

(b)

(c)

BACKLIGHT UNIT USING SEMICONDUCTOR LIGHT-EMITTING ELEMENT

CROSS REFERENCE TO RELATED APPLICATIONS

This application is the National Stage filing under 35 U.S.C. 371 of International Application No. PCT/KR2020/001694, filed on Feb. 6, 2020, which claims the benefit of earlier filing date and right of priority to Korean Application No. 10-2019-0068833, filed on Jun. 11, 2019, the contents of all these applications are hereby incorporated by reference herein in their entirety.

TECHNICAL FIELD

The present disclosure relates to a backlight unit using a semiconductor light-emitting device (or element), and more particularly, to a surface light source using a semiconductor light-emitting device.

BACKGROUND ART

A surface light source using a semiconductor light-emitting device has been applied and used in various places and products such as flat panel lighting, a backlight due to its advantages of lower power consumption and longer lifespan compared to general lighting.

A surface light source using a semiconductor light-emitting device is mainly classified into a reflection method, a light guide method, and a direct method. The refection method is suitable for producing a thin and uniform surface light source with a small number of light sources. As for a liquid crystal display (LCD) device, in particular, there is an increasing need for a thin backlight unit in order to reduce a thickness of a display panel.

The direct method can increase luminous efficacy (or efficiency), but has a limitation in increasing an optical distance, which results in generating lower light uniformity. In the direct method, a hot spot phenomenon that causes brighter areas adjacent to a light source occurs.

Meanwhile, in order to fabricate a backlight unit using a semiconductor light-emitting device, various optical auxiliary materials such as a phosphor sheet and a diffusion plate other than the semiconductor light-emitting device are required. The phosphor sheet including a high-cost phosphor accounts for a large part of manufacturing costs.

Thus, the present disclosure provides a structure capable of reducing the manufacturing costs of a backlight unit including a semiconductor light-emitting device.

DISCLOSURE OF INVENTION

Technical Problem

The present disclosure provides a structure that can minimize the amount or quantity of phosphor used in a backlight unit including a semiconductor light-emitting device.

The present disclosure also provides a structure that can increase light uniformity of a direct backlight unit.

Solution to Problem

According to one aspect of the subject matter described in this application, a backlight unit includes: a base substrate; a partition wall disposed on the base substrate and including a plurality of grooves; semiconductor light-emitting devices assembled on the base substrate and disposed in the grooves, respectively; a phosphor layer that is defined in each of the grooves to cover the semiconductor light-emitting devices and absorbs light in a specific wavelength band to emit light in a wavelength band different from the light in the specific wavelength band; a light diffusion layer that is disposed above the phosphor layer and diffuses light; and a spacer disposed between the partition wall and the light diffusion layer. The spacer includes a body part attached to the partition wall, and a protruding part protruding in a direction toward the light diffusion layer and attached to the light diffusion layer, such that the light diffusion layer and the phosphor layer are spaced apart from each other.

In some implementations, the spacer may be configured as a film, and the protruding part may be formed by bending a portion of the body part.

In some implementations, the partition wall and the protruding part may be spaced apart from each other.

In some implementations, the body part may be attached on one surface, of both surfaces of the partition wall, that faces the light diffusion layer.

In some implementations, the body part may be disposed in a region other than regions in which the grooves are defined, among the entire region of the partition wall.

In some implementations, adhesive layers disposed between the body part and the partition wall, and between the protruding part and the light diffusion layer, respectively, may be further provided.

In some implementations, the light diffusion layer may include a base film and a light diffusion pattern disposed on the base film and including scattering particles.

In some implementations, mass per unit area of the scattering particles included in the light diffusion pattern may increase with a decrease in distance from the semiconductor light-emitting devices.

In some implementations, the protruding part may be disposed to overlap a region having the smallest mass per unit area of the scattering particles included in the light diffusion pattern.

In some implementations, the light diffusion pattern may be disposed on one surface, of both surfaces of the base film, that faces the partition wall.

Advantageous Effects of Invention

According to the present disclosure, as a phosphor is selectively disposed only in a location or area where light conversion is required, the amount of phosphor used in a backlight unit can be minimized.

According to the present disclosure, as a semiconductor light-emitting device and a light diffusion layer are spaced apart by a predetermined distance by a spacer that is dispose between a partition wall and the diffusion layer, light uniformity of the backlight unit can be increased.

According to the present disclosure, since light diffusion occurs intensively in a location or area adjacent to the semiconductor light-emitting device, a hot spot generated in the vicinity of a light source can be minimized.

MODE FOR THE INVENTION

Description will now be given in detail according to exemplary implementations disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the main point of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that when an element such as a layer, area or substrate is referred to as being "on" another element, it can be directly on the element, or one or more intervening elements may also be present.

A lamp disclosed herein may include a mobile phone, a smart phone, a laptop computer, a digital broadcast terminal, a personal digital assistant (PDA), a portable multimedia player (PMP), a navigation device, a slate PC, a tablet PC, an ultrabook, a digital TV, a desktop computer, and the like. However, it will be readily apparent to those skilled in the art that the configuration according to the implementations described herein may also be applied to a new product type of lamp that will be developed later.

Figure 1:
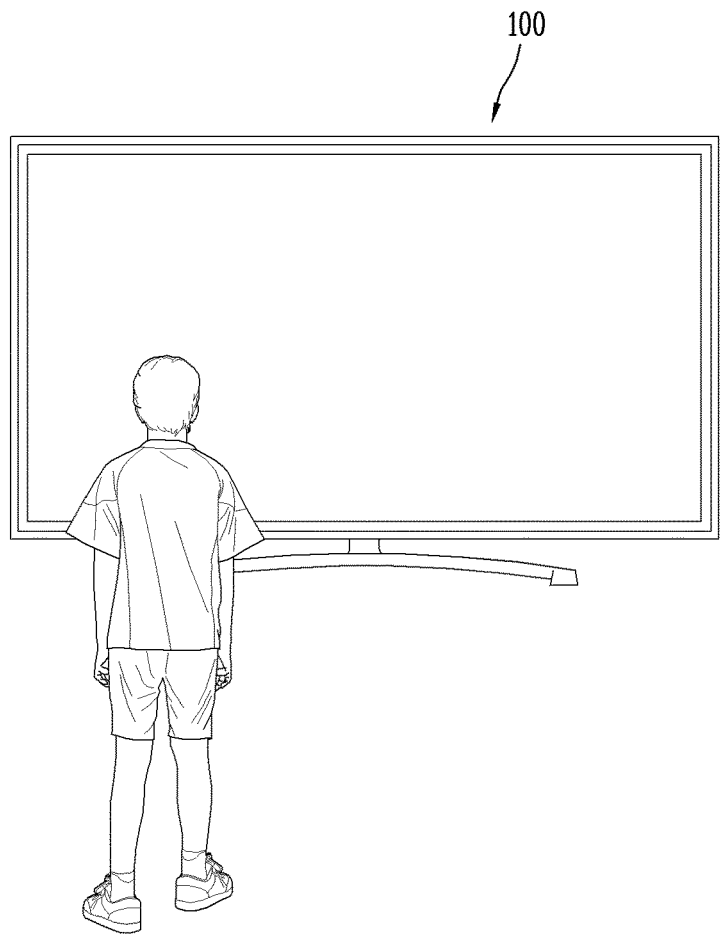
FIG. 1 is a conceptual view illustrating a liquid crystal display device.

A lamp described herein, which is a light source in the form of a surface, may be used in various home appliances. For example, a backlight unit according to the present disclosure may be used as a backlight unit of a liquid crystal display (LCD) display 100 illustrated in FIG. 1. As another example, the backlight unit according to the present disclosure in and out of itself may be utilized as a surface lamp, which may be provided in a home appliance such as a refrigerator.

The backlight unit according to the present disclosure is a light source in the form of a surface that emits light uniformly from all light emitting regions (or areas). In order to realize a light source in the form of a surface, light emitted from the light source should be sufficiently diffused. There are mainly two methods of diffusing light emitted from a light source.

In detail, a method of realizing a light source in the form of a surface may include an edge method in which light emitted from the light source is reflected or emitted to the outside using a light guide plate, and a direct method in which light output from the light source is emitted to the outside without reflecting or guiding it.

Figure 2:
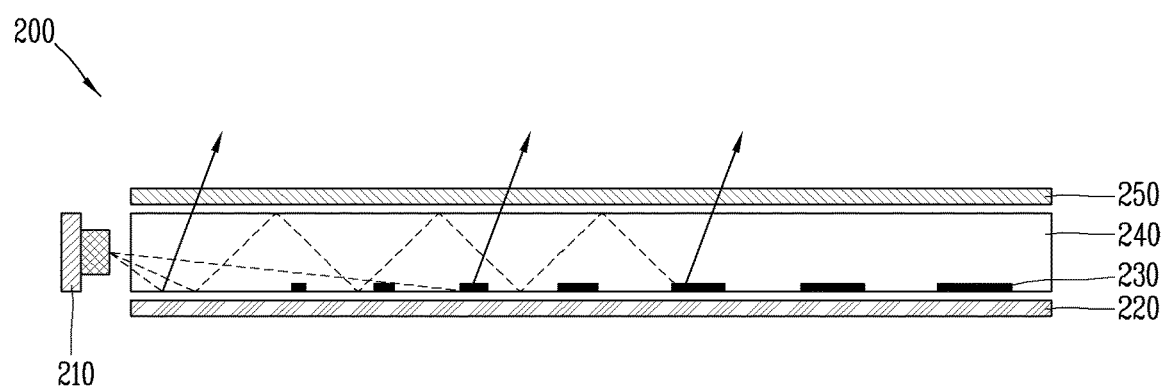
FIG. 2 is a cross-sectional view illustrating an edge backlight unit.

As illustrated in FIG. 2, in the case of an edge backlight unit 200 of the related art, light emitted from a semiconductor light-emitting device 210 is incident on a light incident surface of a light guide layer 240, is reflected from a reflective layer 220 that is disposed below the light guide layer 240 and a reflective pattern 230, and is then emitted to a light output surface of the light guide layer 240 and through an optical sheet 250. Here, the light incident surface and the light output surface are perpendicular to each other. Light emitted from the semiconductor light-emitting device 210 is incident on a side surface of the light guide layer 240 and is emitted to an upper surface of the light guide layer 240. That is, as for the edge backlight unit, a light emitting direction of the semiconductor light-emitting device and a direction that a light emitting surface of the backlight unit is directed are perpendicular to each other.

Figure 3:
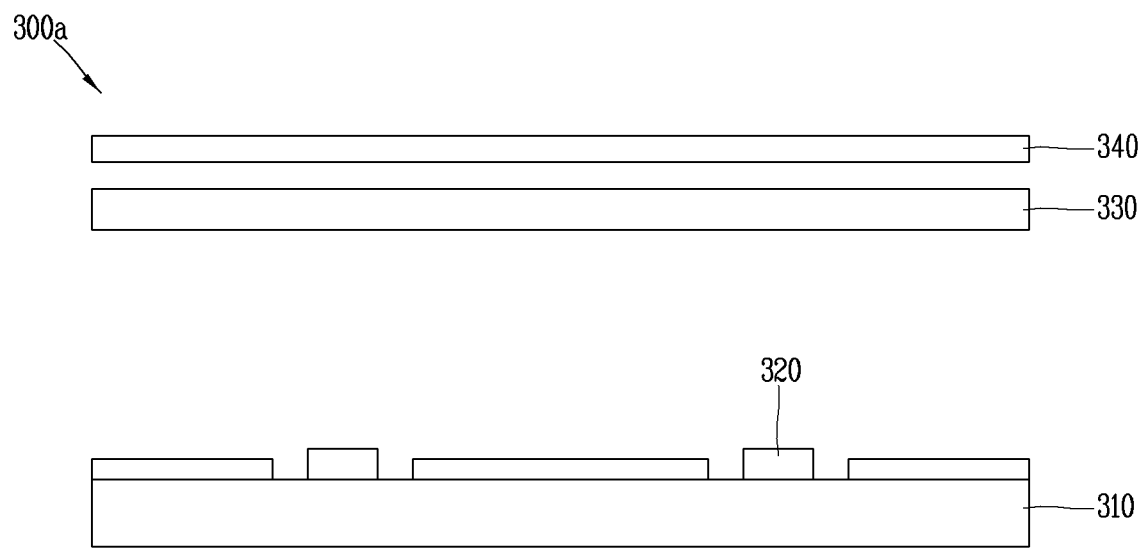
FIGS. 3 and 4 are cross-sectional views illustrating a direct backlight unit.

Unlike this method, referring to FIG. 3, in the case of a direct backlight unit 300a, a semiconductor light-emitting device 320 is disposed on a base substrate 310, and light emitted from the semiconductor light-emitting device 320 is straightly emitted to the outside by passing through a diffusion plate 330 and an optical sheet 340. That is, in the case of the direct backlight unit, a light emitting direction of the semiconductor light-emitting device and a direction that a light emitting surface of the backlight unit is directed are parallel to each other.

Figure 4:
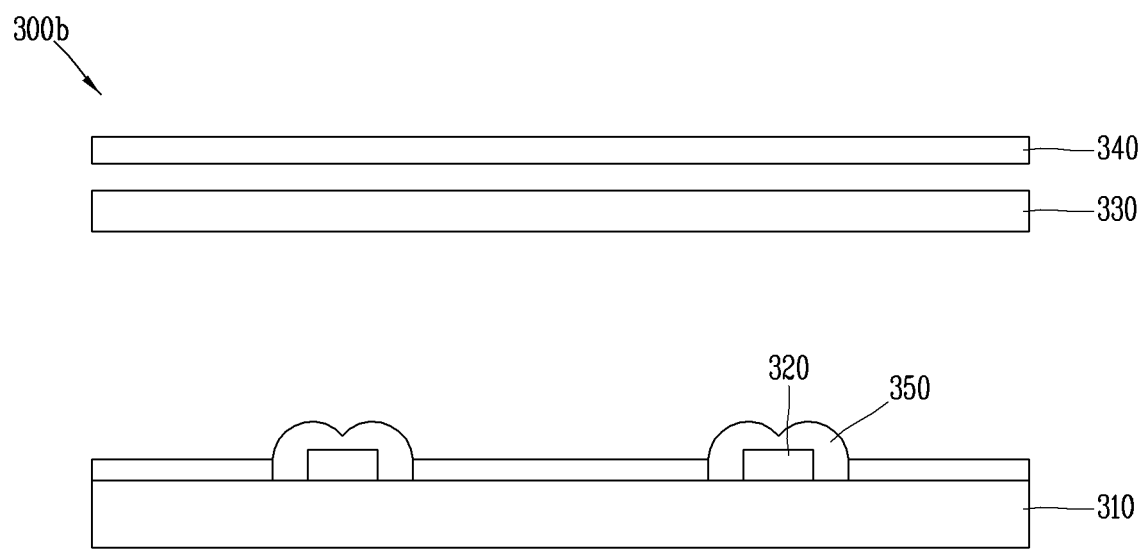

Referring to FIG. 4, an optical lens 350 that disperses light may be used to increase light uniformity of a direct backlight 300b.

In the case of the edge backlight unit, an optical distance may be increased, which is advantageous in that light can be sufficiently diffused without increasing a size of the backlight unit. However, these methods have a disadvantage in that loss occurs while reflecting or guiding light, thereby reducing light efficiency of the backlight unit.

The present disclosure provides a backlight unit using a direct method instead of the edge method described above. As for the direct method, higher optical efficiency can be achieved compared to other methods. However, the amount of phosphor used for light conversion is greater in comparison to the edge method. In addition, the direct method requires a separate structure to increase light uniformity.

The present disclosure provides a structure capable of minimizing the amount of phosphor used in the direct method and increasing light uniformity of the backlight unit.

Hereinafter, a backlight unit according to the present disclosure will be described with reference to the accompanying drawings.

Figure 5:
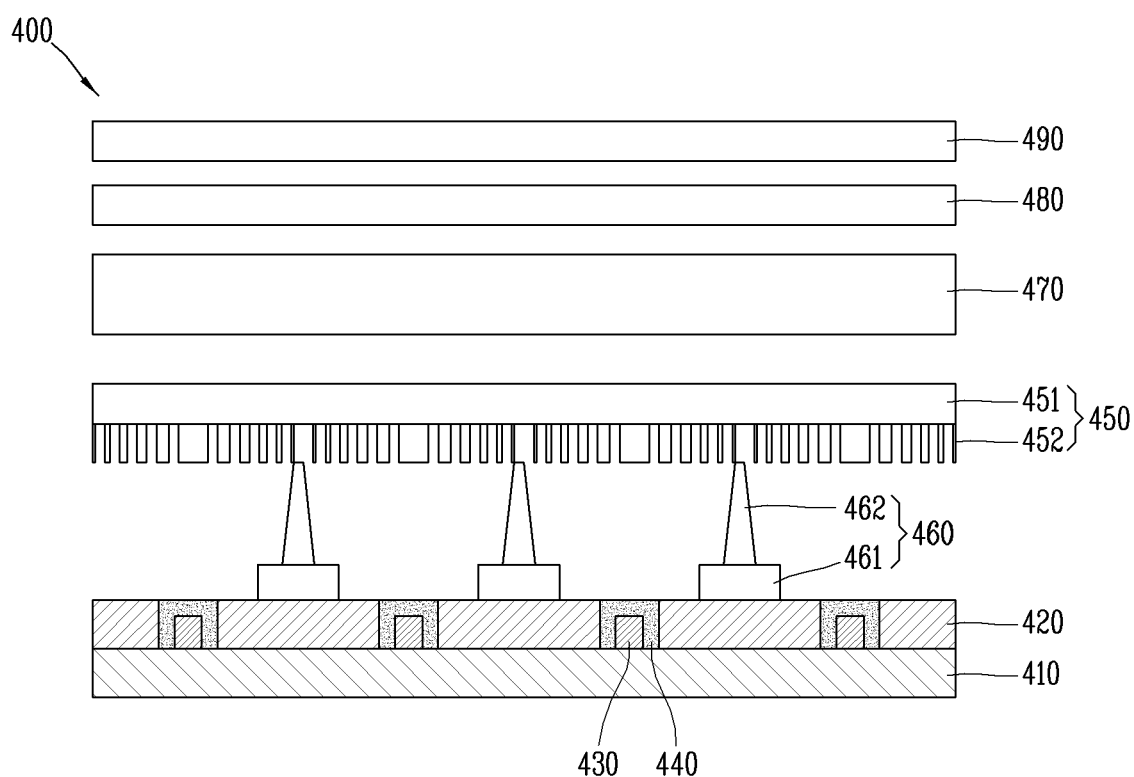
FIG. 5 is a conceptual view illustrating a cross section of a backlight unit according to the present disclosure.

FIG. 5 is a conceptual view illustrating a cross section of a backlight unit according to the present disclosure.

A backlight unit 400 according to the present disclosure includes a base substrate 410, a partition wall 420, semiconductor light-emitting devices (or elements) 430, a phosphor layer (or fluorescent substance layer) 440, a light diffusion layer 450, and a spacer 460. However, the backlight unit according to the present disclosure may include more or fewer components than the components described above.

Hereinafter, the components will be described in detail.

The base substrate 410 may be made of various materials and configured to be flexible or inflexible.

When the base substrate 410 is configured to be flexible, it may contain glass or polyimide (PI). Any material with an insulating property and flexibility, such as Polyethylene Naphthalate (PEN), Polyethylene Terephthalate (PET), and the like, may also be used.

A first electrode and a second electrode (not shown) that are connected to each of the semiconductor light-emitting device 430 may be disposed at one surface of the base substrate 410. Accordingly, the first and second electrodes and the semiconductor light-emitting device 430 may be electrically connected to each other.

In addition, the first and second electrodes and the semiconductor light-emitting device 430 may be brought into physical contact with each other by an adhesive (not shown) having conductivity to thereby achieve an electrical connection. A metal paste (silver paste, tin paste) and solder may be used for the adhesive. However, this is merely illustrative, and the present disclosure is not limited thereto.

The partition wall 420 may be disposed on the base substrate 410. The partition wall 420, which is formed as a film and attached on the base substrate 410, may have an opening in a region or portion where the semiconductor light-emitting device 430 is disposed. In this specification, the opening will be referred to as a 'groove'. The partition wall 420 may be made of a polymer resin, for example, polycarbonate (PC). However, not limited to this material, the partition wall 420 may be made of an insulating material.

In addition to, the partition wall 420 may be made of a highly reflective material that serves to reflect light emitted from side surfaces of a plurality of semiconductor light-emitting devices 430 and improve luminous efficacy of the backlight unit 400. In one implementation, the partition wall 420 may include particles to reflect light emitted from the semiconductor light-emitting device 430 for improving the luminous efficacy of the backlight unit 400. The particles may be titanium oxide ($TiO_2$) particles.

The semiconductor light-emitting device 430 may have a size of several to several tens of micrometers. In detail, the semiconductor light-emitting device 430 may be assembled on the base substrate 410 and disposed between partition walls 420. In addition, the semiconductor light-emitting device 430 is disposed in a groove defined in the partition wall 420.

The semiconductor light-emitting device 430 may include a first conductive electrode, a first conductive semiconductor layer provided with the first conductive electrode 356, an active layer disposed on the first conductive semiconductor layer, a second conductive semiconductor layer disposed on the active layer, and a second conductive electrode disposed on the second conductive semiconductor layer.

The first conductive electrode and the first conductive semiconductor layer may be a p-type electrode and a p-type semiconductor layer, respectively. The second conductive electrode and the second conductive semiconductor layer may be an n-type electrode and an n-type semiconductor layer, respectively. However, the present disclosure is not necessarily limited thereto, and the first conductive type may be an n-type and the second conductive type may be a p-type.

In addition, the phosphor layer 440 may be disposed in the groove to cover the semiconductor light-emitting device 430. In detail, the phosphor layer 440 may fill the groove formed in the partition wall 420.

Further, the phosphor layer 440 may be made of a resin containing a phosphor. In one implementation, the phosphor may include a YAG:Ce-based phosphor to convert light of a semiconductor light-emitting device that emits blue light into yellow light. Some (or part) of light emitted from the semiconductor light-emitting device is absorbed by the phosphor layer 440 and is then converted into yellow light. Among the light emitted from the semiconductor light-emitting device, light that is not absorbed by the phosphor layer 440 and the yellow light are mixed to become white light. Thus, the present disclosure can achieve a backlight unit that emits white light. In another implementation, the phosphor may include a red phosphor and a green phosphor to convert blue light into another color.

Meanwhile, a resin constituting the phosphor layer 440 may be made of a thermosetting material. The resin may be made of a silicone resin. Here, the silicone resin is a resin containing a siloxane bond (Si—O bond) having alternating silicone and oxygen atoms in a molecular structure.

In addition, the phosphor of the phosphor layer 440 may be 50 parts by weight or more. That is, the content of the phosphor per 100 parts by weight of the phosphor layer 440 may be 50 parts by weight or more. Accordingly, when light emitted from the semiconductor light-emitting device 430 is color converted through the phosphor, color temperature and color conversion may be sufficiently achieved by the phosphor. In other words, when the content of the phosphor is less than 50 parts by weight based on the total weight of the phosphor layer 440, color conversion of light emitted from the semiconductor light-emitting device 430 may not be sufficiently done.

Before describing other components included in the backlight unit according to the present disclosure, a structure and a fabrication method for minimizing the amount of phosphor used in the backlight unit will be described.

Figure 6:
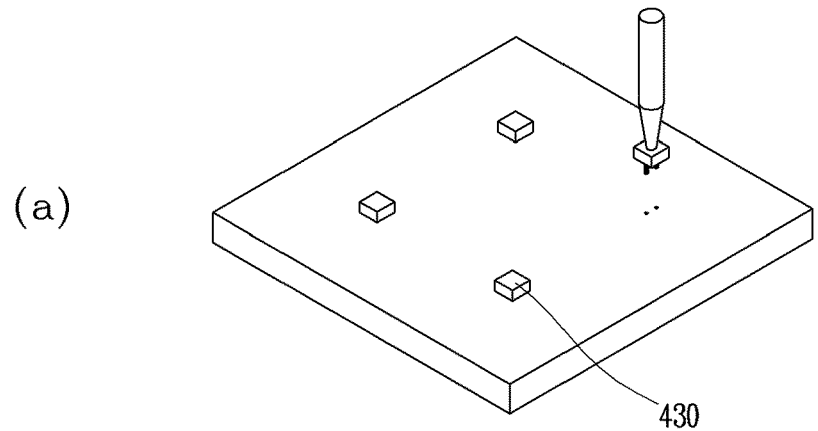
FIGS. 6 and 7 are conceptual views illustrating a method of fabricating the backlight unit according to the present disclosure.
Figure 6:
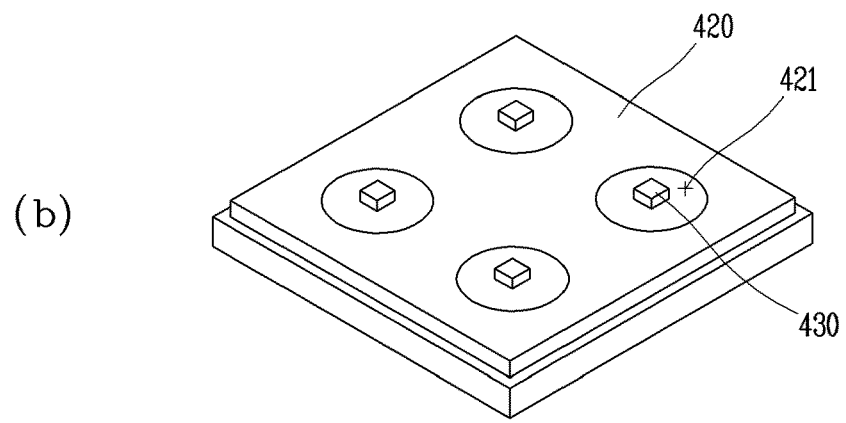
Figure 6:
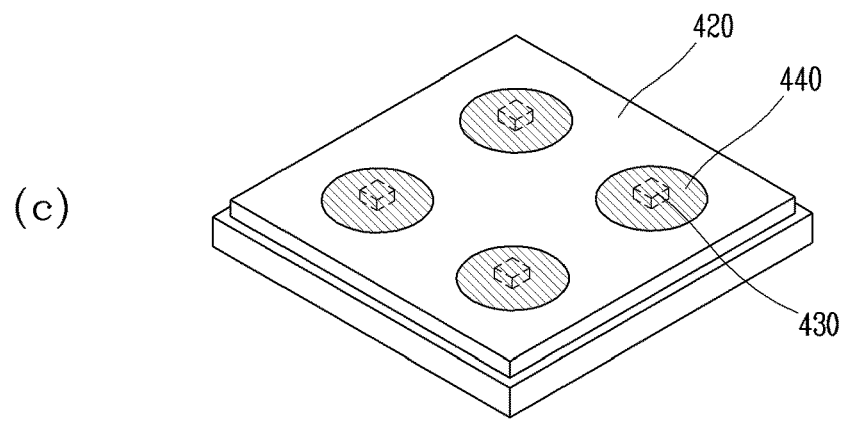
Figure 7:
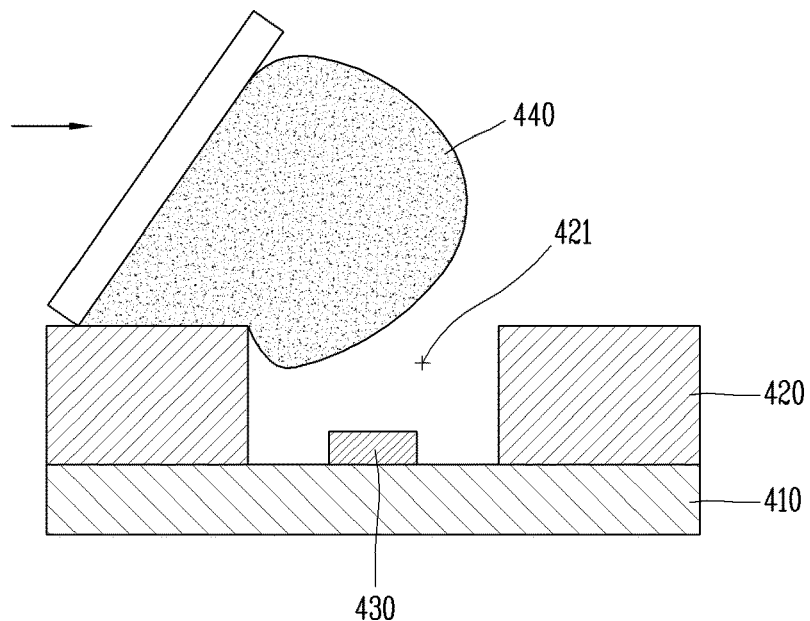

FIGS. 6 and 7 are conceptual views illustrating a method of fabricating the backlight unit according to the present disclosure.

Referring to FIG. 6, a step (or process) of placing semiconductor light-emitting devices on a base substrate is carried out. Although not illustrated, wiring electrodes are formed on the base substrate. In this step, the semiconductor light-emitting devices and the wiring electrodes may be electrically connected to each other.

Next, a step of forming a partition wall 420 on the base substrate is performed. The partition wall 420 may be formed by a printing or coating method. In detail, when printing a material constituting the partition wall 420 on the base substrate, regions around the semiconductor light-emitting devices are excluded. This may allow a partition wall including a plurality of grooves to be formed.

In another implementation, the partition wall 420 may be formed by attaching a film including a plurality of holes to a base substrate on which semiconductor light-emitting devices are disposed. Here, intervals between the plurality of holes should be the same as intervals between the semiconductor light-emitting devices disposed on the base substrate.

As such, the present disclosure can simplify the process of fabricating the backlight unit by using the printing or coating method. When these steps are completed, a structure in which the semiconductor light-emitting devices 430 are respectively seated in grooves 421 is complete.

Finally, a step of filling a phosphor into each of the grooves 421 is performed. In detail, referring to FIG. 7, the phosphor layer 440 may be filled in the groove 421 by a printing squeeze method. Accordingly, the phosphor does not cover the entire base substrate 410, but is selectively provided only in a region where the semiconductor light-emitting device 430 is disposed. Thus, the present disclosure can minimize the amount of phosphor used in the direct backlight unit.

Meanwhile, the present disclosure includes a structure for increasing light uniformity of the backlight unit. In detail, the backlight unit according to the present disclosure includes a light diffusion layer 450 disposed above the phosphor layer 440 to diffuse light, and a spacer 460 disposed between the partition wall 420 and the light diffusion layer 450.

Referring back to FIG. 5, the light diffusion layer 450 may include a base film 451 and a light diffusion pattern 452 formed on the base film 451. The base film 451 serves to support the light diffusion pattern 452 and is made of a light transmissive material.

The light diffusion pattern 452 may include scattering particles that are formed by being printed on the base film 451. The light diffusion pattern 452 scatters incident light to improve light uniformity of the backlight unit.

A degree of light diffusion may vary according to the number of scattering particles included in the light diffusion pattern 452. The present disclosure controls or adjusts the degree of light diffusion by varying the mass per unit area of scattering particles included in the light diffusion pattern. This will be described later.

The light diffusion pattern 452 is formed on one of both surfaces of the base film 451. In one implementation, the light diffusion pattern 452 may be disposed on one surface, of the both surfaces of the base film 451, that faces the partition wall 420.

Meanwhile, in terms of light uniformity, the light diffusion layer 450 and the semiconductor light-emitting device 430 and the phosphor layer 440 may be spaced apart by a predetermined distance. The present disclosure includes the spacer 460 disposed between the partition wall 420 and the light diffusion layer 450 to improve the light uniformity of the backlight unit.

Referring to FIG. 5, the spacer 460 may include a body part 461 attached to the partition wall 420 and protruding parts 462 protruding in a direction toward the light diffusion layer 450 and attached to the diffusion layer 450, such that the light diffusion layer 450 and the phosphor layer 440 are spaced apart from each other.

Hereinafter, a structure of the spacer included in the backlight unit according to the present disclosure will be described in more detail.

FIGS. 8 to 11 are conceptual views illustrating a structure of a spacer included in the backlight unit according to the present disclosure.

Figure 8:
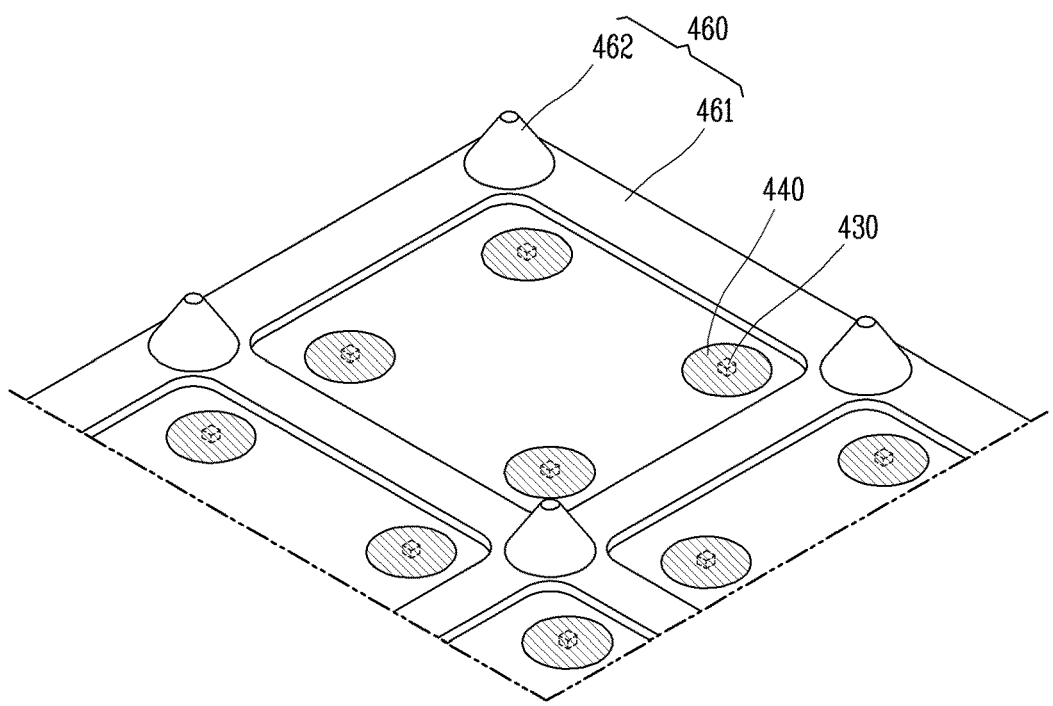
FIGS. 8 to 11 are conceptual views illustrating a structure of a spacer included in the backlight unit according to the present disclosure.

Referring to FIG. 8, the body part 461 included in the spacer 460 serves to fix the spacer 460. The body part 461 may be attached to one surface, of both surfaces of the partition wall 420, that faces the light diffusion layer 450 in the form of a mesh.

The spacer 460 may be made of a light transmissive material. In one implementation, the spacer 460 may be made of one of PET, PC, and PMMA.

The body part 461 is attached to a region other than regions in which the grooves are defined, among the entire region of the partition wall 420. Accordingly, the body part 461 is disposed between the semiconductor light-emitting devices 430 and does not overlap the semiconductor light-emitting devices 430.

Figure 9:
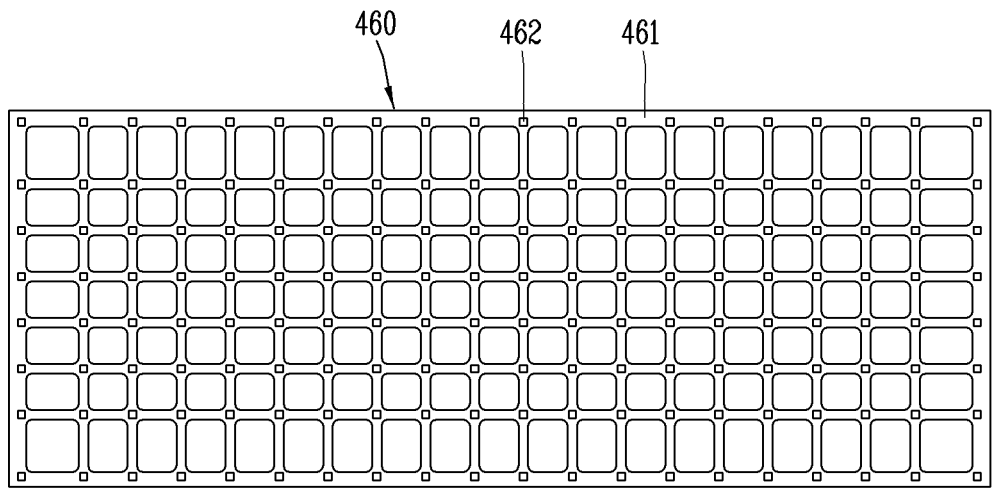

More specifically, referring to FIG. 9, the body part 461 of the spacer 460 may be formed in a mesh shape. The protruding parts 462 may be formed on the body part 461 at regular intervals. The spacer 460 illustrated in FIG. 9 may be attached on the partition wall 420 after the fabrication method according to FIG. 6 is completed. Here, the protruding parts 462 should be disposed toward a direction opposite to a direction directed to the partition wall 420. Then, the light diffusion layer 450 may be stacked or disposed on the spacer 460.

Meanwhile, the spacer 460 may be made of a light transmissive film. In detail, the spacer 460 may be configured as a film, and each of the protruding parts 462 may be formed by bending a portion of the body part 461.

Figure 10:
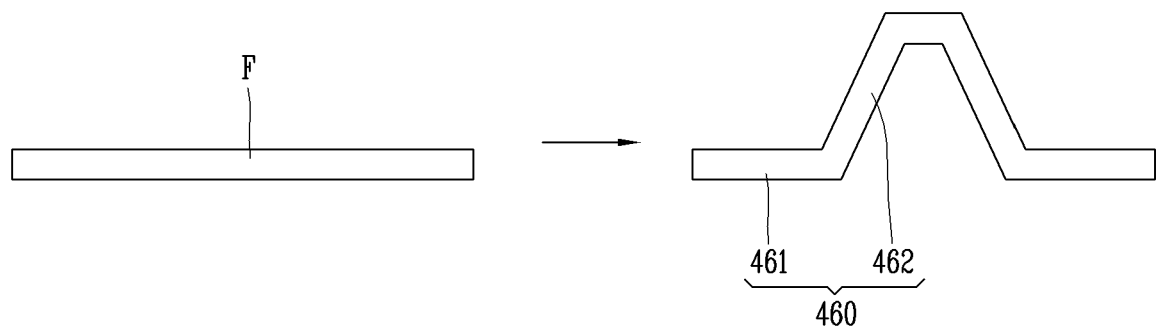

In detail, referring to FIG. 10, the protruding part 462 may be formed by processing a light transmissive film F. Among the entire region of the light transmissive film F, a non-bent region (or portion) becomes the body part 461, and a bent region (or portion) becomes the protruding part 462.

Here, each of the protruding parts 462 may be spaced apart from the partition wall 420, and an air gap may be formed between the partition wall 420 and the protruding part 462. The air gap may totally reflect light reflected from an upper part of the spacer 460 and traveling in a direction toward the partition wall 420, allowing light extraction efficiency of the backlight unit to be increased. In addition, the air gap serves as a buffer member against external impact.

The spacer 460 is used to maintain a predetermined distance between the light diffusion layer 450 and the phosphor layer 440 for securing an optical distance. In addition, the spacer 460 is used as a member for coupling different components. In detail, the body part 461 is attached to one surface of the partition wall 420, and the protruding parts 462 are attached to the light diffusion pattern 452. This can facilitate coupling of the partition wall 420 and the light transmissive layer.

Figure 11:
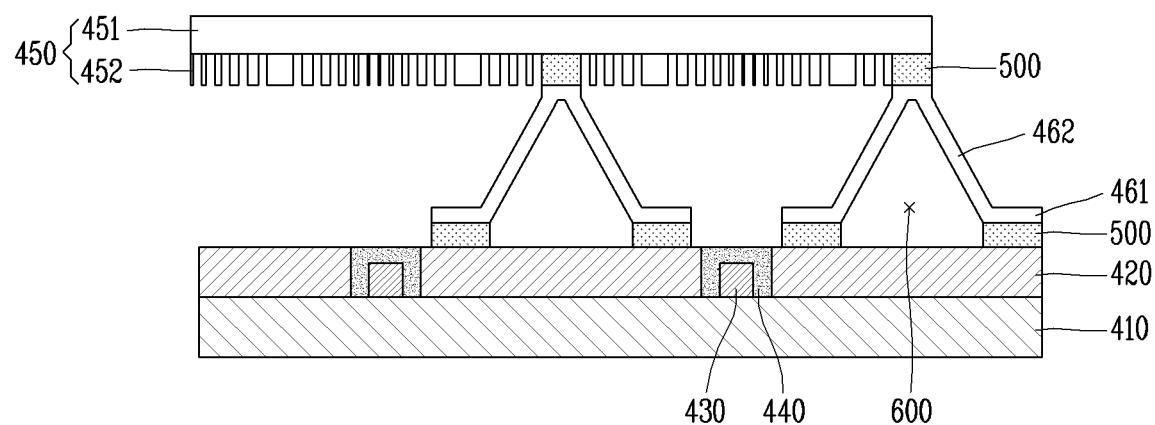

Referring to FIG. 11, adhesive layers 500 may be formed between the body part 461 and the partition wall 420, and between the protruding part 462 and the light diffusion layer 450, respectively, in order to improve a coupling force of the spacer 460. A space 600 may be defined by the adhesive layers 500, the body part 461, the protruding part 462, and the partition wall 420.

The adhesive layer 500 may be made of a light transmissive material and a bonding material or an adhesive material. For example, the adhesive layer 500 may be formed of OCA.

Meanwhile, in the present disclosure, the degree of light diffusion is controlled by varying the mass per unit area of scattering particles included in the light diffusion pattern.

Figure 12:
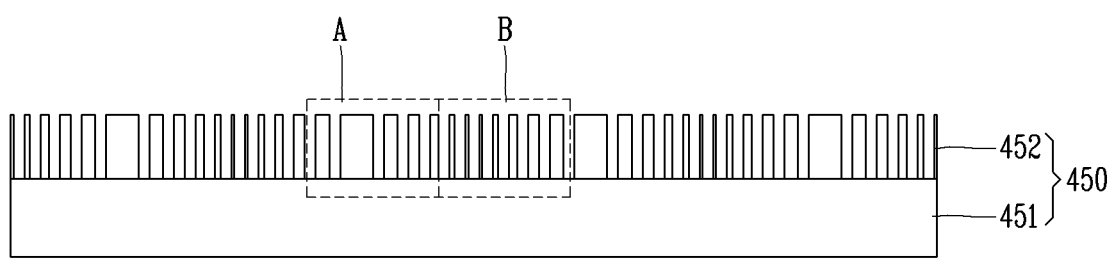
FIG. 12 is a cross-sectional view of a light diffusion layer.
Figure 13:
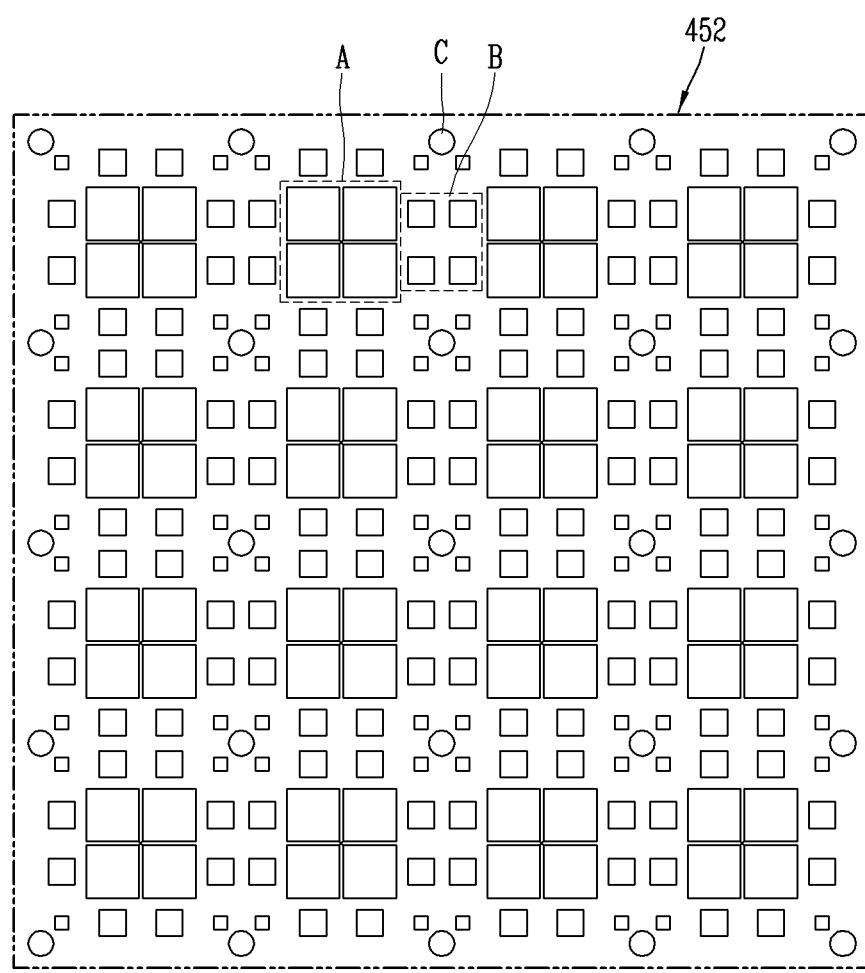
FIG. 13 is a conceptual view illustrating a light diffusion pattern.

FIG. 12 is a cross-sectional view of a light diffusion layer, and FIG. 13 is a conceptual view illustrating a light diffusion pattern.

The mass per unit area of scattering particles included in the light diffusion pattern 452 may increase with a decrease in distance from the semiconductor light-emitting device 430. In detail, referring to FIG. 12, the light diffusion pattern 452 is unevenly or non-uniformly formed on the base film 451. The mass of scattering particles included in a region A is greater than the mass of scattering particles included in a region B. As the region A is disposed to overlap the semiconductor light-emitting device 430, the mass per unit area of the scattering particles included in the light diffusion pattern 452 may increase with a decrease in distance from the semiconductor light-emitting device 430.

Regions A and B illustrated in FIG. 13 are the same as the regions A and B illustrated in FIG. 12. The mass of scattering particles arranged in the region A is greater than the mass of scattering particles arranged in the region B. The region A is disposed to overlap the semiconductor light-emitting device, and the region B is disposed between the semiconductor light-emitting devices.

Meanwhile, the protruding part 462 included in the spacer 460 may be disposed to overlap a region having the smallest mass per unit area of the scattering particles included in the light diffusion pattern 452.

A region C illustrated in FIG. 13 is a region in which scattering particles are not disposed, among the entire region of the light diffusion pattern 452. The light diffusion pattern 452 may be formed by printing an ink including scattering particles on the base film 451. Here, the ink may fall out due to the protruding part 462. In order to prevent this, the protruding part 462 is disposed to overlap the region having the smallest mass per unit area of the scattering particles included in the light diffusion pattern 452.

The protruding part 462 may cause unnecessary interference to light emitted from the semiconductor light-emitting device and the phosphor layer, the protruding part 462 should be disposed as far as possible from the semiconductor light-emitting devices. When the protruding part 462 is disposed to overlap the region having the smallest mass per unit area of the scattering particles included in the light diffusion pattern 452, the protruding parts 462 may be located at the farthest distance from the semiconductor light-emitting devices.

The light diffusion pattern 452 allows a distance between the partition wall 420 and the light diffusion layer 450 to be minimized. In detail, without the light diffusion pattern 452, in order to achieve a predetermined level of light uniformity, a value obtained by dividing a distance p between adjacent semiconductor light-emitting devices by a distance h between the partition wall 420 and an optical sheet (470, 480, 490) should be close to 1.

In order to reduce a value of the h, the distance p between the semiconductor light-emitting devices should be reduced. This means an increase in the number of semiconductor light-emitting devices required for implementing a surface light source of the same area. This may result in increasing the manufacturing cost of the backlight unit. In addition, a decreased distance between the semiconductor light-emitting devices causes a difficulty in arranging other additional structures.

When the light diffusion pattern 452 is used, a p/h value for realizing a predetermined level of light uniformity is greater than or equal to 2. That is, when the same number of semiconductor light emitting-devices is used, a thickness of the backlight unit can be reduced.

As such, the light diffusion pattern 452 allows the thickness of the direct backlight unit to be reduced.

Referring back to FIG. 5, the backlight unit according to the present disclosure may include an optical sheet part (470, 480, 490). The optical sheet part (470, 480, 490) serves to further improve light uniformity of the backlight unit. The optical sheet part (470, 480, 490) may consist of a plurality of layers, but the number of the layers is not specifically limited. The layer defining the optical sheet part (470, 480, 490) may include scattering particles that scatter light.

According to the present disclosure, as a phosphor is selectively provided only in a location where light conversion is required, the amount of phosphor used in the backlight unit can be minimized.

Also, according to the present disclosure, as the semiconductor light-emitting device and the light diffusion layer are spaced apart by a predetermined distance by the spacer that is disposed between the partition wall and the light diffusion layer, light uniformity of the backlight unit can be increased.

Further, according to the present disclosure, since light diffusion occurs intensively in a location adjacent to the semiconductor light-emitting device, a hot spot generated in the vicinity of the light source can be minimized.

The aforementioned lamp using the semiconductor light-emitting devices is not limited to the configuration and the method of the implementations described above, but the implementations may be configured such that all or some of the implementations are selectively combined so that various modifications can be made.

The invention claimed is:

1. A backlight unit, comprising:
a partition wall disposed on a base substrate and including a plurality of grooves;
semiconductor light-emitting devices assembled on the base substrate and disposed in the plurality of grooves, respectively;
a phosphor layer that is defined in each of the plurality of grooves to cover the semiconductor light-emitting devices and absorbs light in a specific wavelength band to emit light in a wavelength band different from the light in the specific wavelength band;
a light diffusion layer that is disposed above the phosphor layer and diffuses light; and
a spacer disposed between the partition wall and the light diffusion layer,
wherein the spacer comprises:
a body part attached to the partition wall; and
a protruding part protruding in a direction toward the light diffusion layer and attached to the light diffusion layer, so that the light diffusion layer and the phosphor layer are spaced apart from each other,
wherein a height of an uppermost surface of the phosphor layer is less than a height of an uppermost surface of the body part of the spacer,
wherein the spacer is configured as a film, and
wherein the protruding part is formed by bending a portion of the body part.

2. The backlight unit of claim 1, wherein the partition wall and the protruding part are spaced apart from each other.

3. The backlight unit of claim 1, wherein the body part is attached on one surface, of both surfaces of the partition wall, that faces the light diffusion layer.

4. The backlight unit of claim 3, wherein the body part is disposed in a region other than regions in which the plurality of grooves are defined, among the entire region of the partition wall.

5. The backlight unit of claim 1, further comprising adhesive layers disposed between the body part and the partition wall, and between the protruding part and the light diffusion layer, respectively.

6. The backlight unit of claim 5, further comprising a space defined by the adhesive layers, the body part, the protruding part, and the partition wall.

7. The backlight unit of claim 1, wherein the light diffusion layer comprises:
a base film; and
a light diffusion pattern disposed on the base film and including scattering particles.

8. The backlight unit of claim 7, wherein a mass per unit area of the scattering particles included in the light diffusion pattern increases with a decrease in distance from the semiconductor light-emitting devices.

9. The backlight unit of claim 8, wherein the protruding part is disposed to overlap a region having the smallest mass per unit area of the scattering particles included in the light diffusion pattern.

10. The backlight unit of claim 9, wherein the light diffusion pattern is disposed on one surface, among surfaces of the base film, that faces the partition wall.

11. The backlight unit of claim 1, wherein an exposed surface of the phosphor layer and an exposed surface of the partition wall are coplanar.

12. The backlight unit of claim 1, wherein the body part is formed in a mesh shape having intersecting portions, and
wherein the protruding part is located at the intersecting portions.

13. The backlight unit of claim 1, wherein the protruding part form legs that extend from the partition wall to the light diffusion layer at an angle.

14. A method of forming the backlight unit of claim 1, the method comprising:
placing the semiconductor light-emitting devices on the base substrate;
forming the partition wall on the base substrate having the semiconductor light-emitting devices, so that the semiconductor light-emitting devices are located in grooves of the partition wall;
filling phosphor into each of the grooves to cover respective semiconductor light-emitting devices in each of the grooves;
placing the spacer on the partition wall; and
placing the light diffusion layer on the space,
wherein the filling of the phosphor into each of the grooves uses a printing squeeze method.

15. A backlight unit, comprising:
a base substrate;
semiconductor light-emitting devices on the base substrate;
a partition wall disposed on the base substrate except around the semiconductor light-emitting devices;
a phosphor layer covering the semiconductor light emitting devices, wherein an exposed surface of the phosphor layer and an exposed surface of the partition wall are coplanar;
a spacer disposed on the partition wall; and
a light diffusion layer on the spacer and separated from the partition layer and the phosphor layer,
wherein a height of an uppermost surface of the phosphor layer is less than or equal to a height of an uppermost surface of the partition wall,
wherein the spacer comprises:
a body part attached to the partition wall; and
a protruding part protruding in a direction toward the light diffusion layer and attached to the light diffusion layer; and
wherein the body part is formed in a mesh shape having intersecting portions, and the protruding part is located at the intersecting portions.

16. The backlight unit of claim 15, wherein the protruding part forms legs that extend from the partition wall to the light diffusion layer at an angle.

17. The backlight unit of claim 15, further comprising a space defined by the body part, the protruding part, and the partition wall.

18. The backlight unit of claim 15, wherein the light diffusion layer comprises:
a base film; and
a light diffusion pattern disposed on the base film and including scattering particles, and
wherein a mass per unit area of the scattering particles included in the light diffusion pattern increases with a decrease in distance from the semiconductor light-emitting devices.

* * * * *